US006741662B1

United States Patent
Francos et al.

(10) Patent No.: US 6,741,662 B1
(45) Date of Patent: May 25, 2004

(54) TRANSMITTER LINEARIZATION USING FAST PREDISTORTION

(75) Inventors: Amir Francos, Tel-Aviv (IL); Ilan Barak, Kfar-Saba (IL); Daniel Yellin, Raanana (IL); Avner Dor, Kiryat-Ono (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/550,855

(22) Filed: Apr. 17, 2000

(51) Int. Cl.[7] ................................................. H03F 1/26
(52) U.S. Cl. ........................................ 375/297; 375/296
(58) Field of Search ................................. 375/295, 296, 375/297

(56) References Cited

U.S. PATENT DOCUMENTS

| | | | |
|---|---|---|---|
| 4,291,277 A | | 9/1981 | Davis et al. |
| 5,049,832 A | | 9/1991 | Cavers |
| 5,923,712 A | * | 7/1999 | Leyendecker et al. ...... 375/297 |
| 6,141,390 A | * | 10/2000 | Cova .......................... 375/297 |

OTHER PUBLICATIONS

Cavers, J.; "The Effect of Quadrature Modulator and Demodulator Errors on Adaptive Digital Predistorters for Amplifier Linearization"; IEEE Trans. On Vehicular Technology; vol. 46; No. 2; May 1997; pp. 456–466.

Sundstrom, L. et al.; "Effects of Reconstruction Filters in Digital Predistortion Linearizers for RF Power Amplifiers"; IEEE Trans. On Vehicular Technology; vol. 44; No. 1; Feb. 1995; pp. 131–139.

Wright, A. et al.; "Experimental Performance of an Adaptive Digital Linearized Power Amplifier"; IEEE Trans. On Vehicular Technology; vol. 41; No. 4, Nov. 1992; pp. 395–400.

Cavers, J.; "New Methods for Adaptation of Quadrature Modulators and Demodulators Amplifier Linearization Circuits"; IEEE Trans. On Vehicular Technology; vol. 46; No. 3; Aug. 1997; pp. 707–716.

Sundström, L. et al.; "Quantization Analysis and Design of a Digital Predistortion Linearizer for RF Power Amplifiers"; IEEE Trans. On Vehicular Technology; vol. 45; No. 4; Nov. 1996; pp. 707–719.

Cavers, J.; "Optimum Table Spacing in Predistorting Amplifier Linearizers"; IEEE Trans. On Vehicular Technology; vol. 48; No. 5; Sep. 1999; pp. 1699–1705.

Cavers, J.; "Amplifier Linearization Using a Digital Predistorter with Fast Adaptation and Low Memory Requirements"; IEEE Trans. On Vehicular Technology; vol. 39; No. 4; Nov. 1990; pp. 374–382.

\* cited by examiner

*Primary Examiner*—Stephen Chin
*Assistant Examiner*—Lawrence Williams
(74) *Attorney, Agent, or Firm*—Eitan, Pearl, Latzer & Cohen Zedek, LLP

(57) ABSTRACT

A method of generating values of a predistortion look up table for linearization of a transmitter. The method includes accumulating a plurality of pairs of values representing input and output values of samples entering one or more non-linear elements of the transmitter, fitting the pairs of values into a parameteric model of at least one of the one or more non-linear elements, so as to determine values for the parameters of the parameteric model, and generating values of the look up table responsive to the fitted parameteric model.

20 Claims, 6 Drawing Sheets

TRANSMITTER LINEARIZATION USING FAST PREDISTORTION

FIELD OF THE INVENTION

The present invention relates to wireless transmission and in particular to non-linear transmitters which use predistortion.

BACKGROUND OF THE INVENTION

FIG. 1 is a block diagram of a typical radio frequency transmitter 10, used in mobile phones. Generally, radio frequency (RF) transmitter 10 comprises a power amplifier (PA) 12 which amplifies the signals being transmitted from an antenna 14. For efficiency, amplifier 12 is, in many cases, a non-linear amplifier operated near its peak capacity. To avoid distortion of the transmitted signals due to the non-linearity, the signals are pre-distorted by a predistorter 15 before they are transmitted. The predistortion is required to prevent transmitter 10 from transmitting signals on channel bands other than the band assigned to the transmitter. A multiplier 16 of predistorter 15 multiplies modulated signals prepared for transmission by predistortion values. The predistortion values are chosen such that the product values entering amplifier 12 will be distorted by the power amplifier to return to a substantially linear amplification of the modulated signals. The predistortion values are generally selected from a look up table (LUT) 18 which is indexed by the amplitude of the multiplied transmitted signal. As the exact predistortion caused by the amplifier varies with time and carrier frequency, due to temperature, aging and other characteristics of power amplifier 12, the predistortion values in LUT 18 are updated, by a trainer 20, based on feedback received from the output of amplifier 12.

A paper titled "Amplifier Linearization Using a Digital Predistorter with Fast Adaptation and Low Memory Requirements", J. K. Cavers, IEEE Trans. On Vehicular Technology, Vol. 39, No. 4, Nov. 1990, and U.S. Pat. No. 5,049,832 to Cavers, describe an adaptive method for calculating the predistortion values of LUT 18. In this method, LUT 18 is assigned initial random values which are thereafter updated adaptively. For each sample provided to predistorter 15 and thereafter to power amplifier 12, the difference between the desired amplification and the actual amplification of the power amplifier is calculated and accordingly the corresponding entry in LUT 18 is adjusted. This method, however, does not converge fast enough to fulfill requirements of emerging standards.

U.S. Pat. No. 5,923,712 to Leyendecker et al., describes another method for calculating the predistortion values of LUT 18. In the method of the U.S. Pat. No. 5,923,712 patent, trainer 20 accumulates a plurality of sets of three values including the modulated value being provided to predistorter 15, the value after it is pre-distorted (as it enters to power amplifier 12) and the value at the output of power amplifier 12. Periodically trainer 20 divides the recently accumulated sets into bins which correspond to the entries of LUT 18. These entries of LUT 18 are indexed using the values provided to predistorter 15. Using the accumulated values of each bin, trainer 20 directly determines an inverse transfer function of the power amplifier for the specific bin. The inverse transfer function is determined by calculating the transfer function of power amplifier 12 from its output to its input. According to the inverse transfer function of the specific bin the corresponding entry of LUT 18 is updated. Bins which have too few samples are not used for updating the entries of LUT 18, and instead interpolation is performed using neighboring bins.

The method of the U.S. Pat. No. 5,923,712 patent, however, does not operate fast enough and does not reach high enough levels of accuracy, for example, due to impairments of analog components of the transmitter. In order to compensate for inaccuracies, the U.S. Pat. No. 5,923,712 patent suggests using previous sample information in determining which entry of the LUT 18 is to be used and in updating the LUT 18. The use of the previous sample information, by the trainer 20 of the U.S. Pat. No. 5,923,712 patent, complicates the trainer, increases the size of its memory buffer and enlarges its current consumption.

BRIEF DESCRIPTION OF FIGURES

Particular embodiments of the invention will be described with reference to the following description of embodiments in conjunction with the figures, wherein identical structures, elements or parts which appear in more than one figure are labeled with a same or similar number in all the figures in which they appear, in which.

DETAILED DESCRIPTION OF EMBODIMENTS

An aspect of some embodiments of the invention relates to a predistortion LUT trainer which uses a plurality of different calculation methods in determining the values of the LUT. In an exemplary embodiment, a two-stage method of calculating predistortion values is used. In a first stage, initial predistortion values are calculated using a non-adaptive method. Thereafter, an adaptive method is used to adjust the initial predistortion values.

An aspect of some embodiments of the invention relates to a method of determining the values of a predistortion LUT. A plurality of pairs of input and output values of the power amplifier are accumulated and a transfer model related to the power amplifier is prepared by fitting the accumulated values into a parametric model, characteristic of the transfer model related to the power amplifier. In an embodiment of the present invention, the transfer model related to the power amplifier comprises an inverse transfer model which represents the transfer function of the power amplifier from its output to its input. The values of the LUT are generated based on the prepared transfer model.

The inverse transfer model represents the function required to be performed by the predistorter. In an exemplary embodiment, the transfer model comprises a polynomial model. In an embodiment of the invention, the accumulated values are fit into the model using least square (LS) fitting. Alternatively or additionally, any other suitable fitting method is used.

Figure 1:
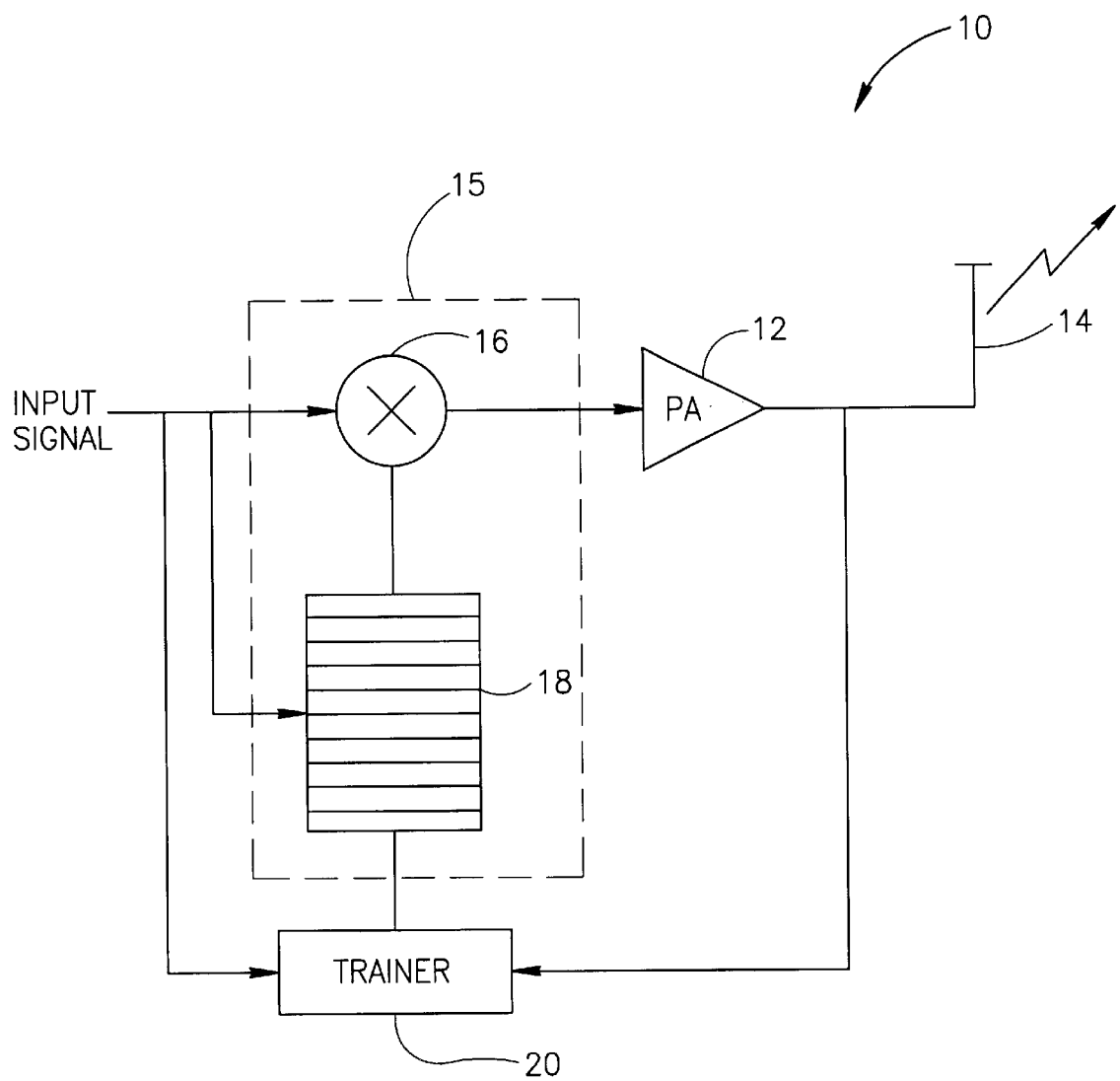
FIG. 1 is a schematic illustration of a transmitter as is known in the art.
Figure 2A:
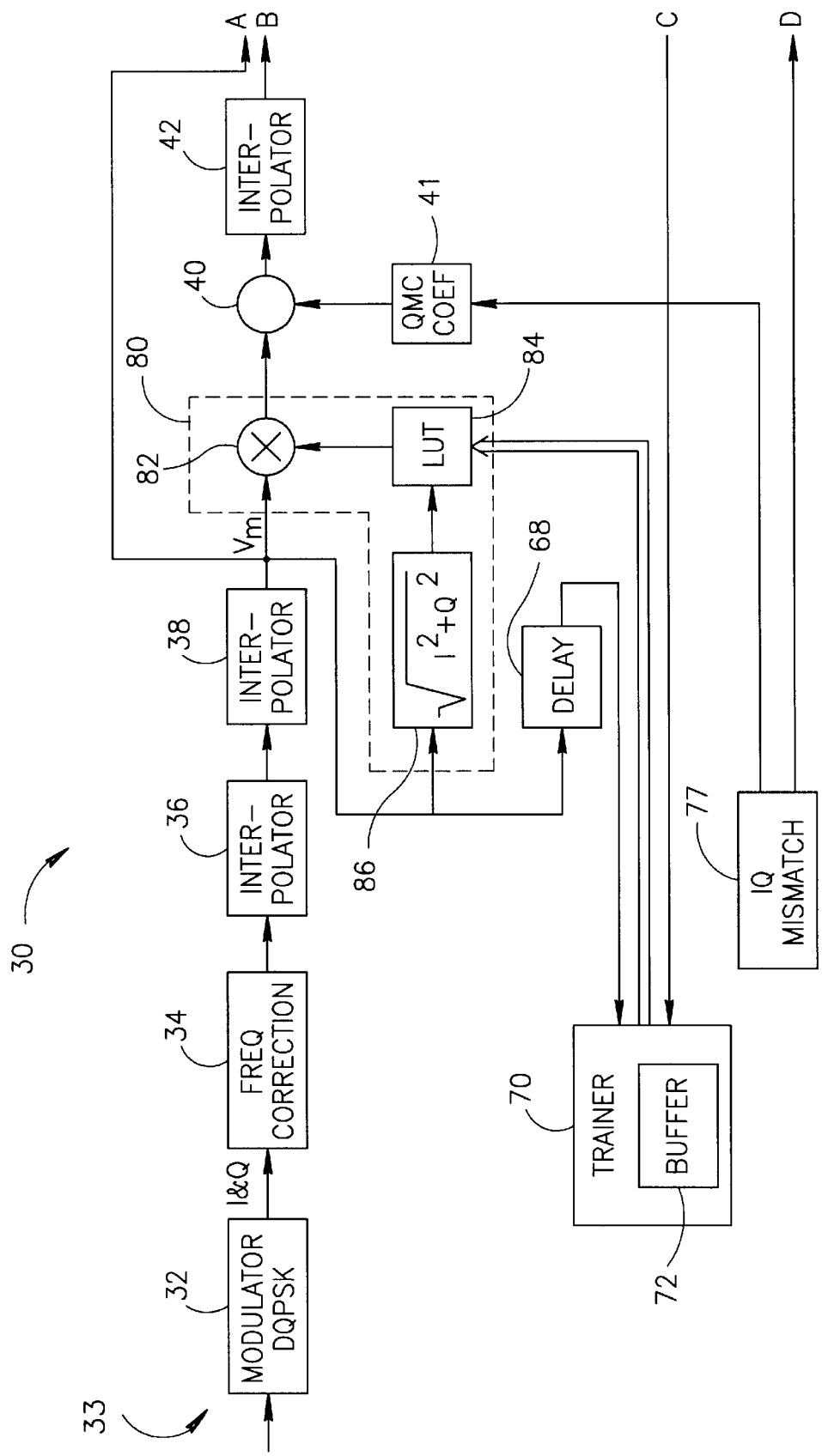
FIGS. 2A and 2B are a schematic block diagram of a transmitter, in accordance with an embodiment of the present invention.
Figure 2B:
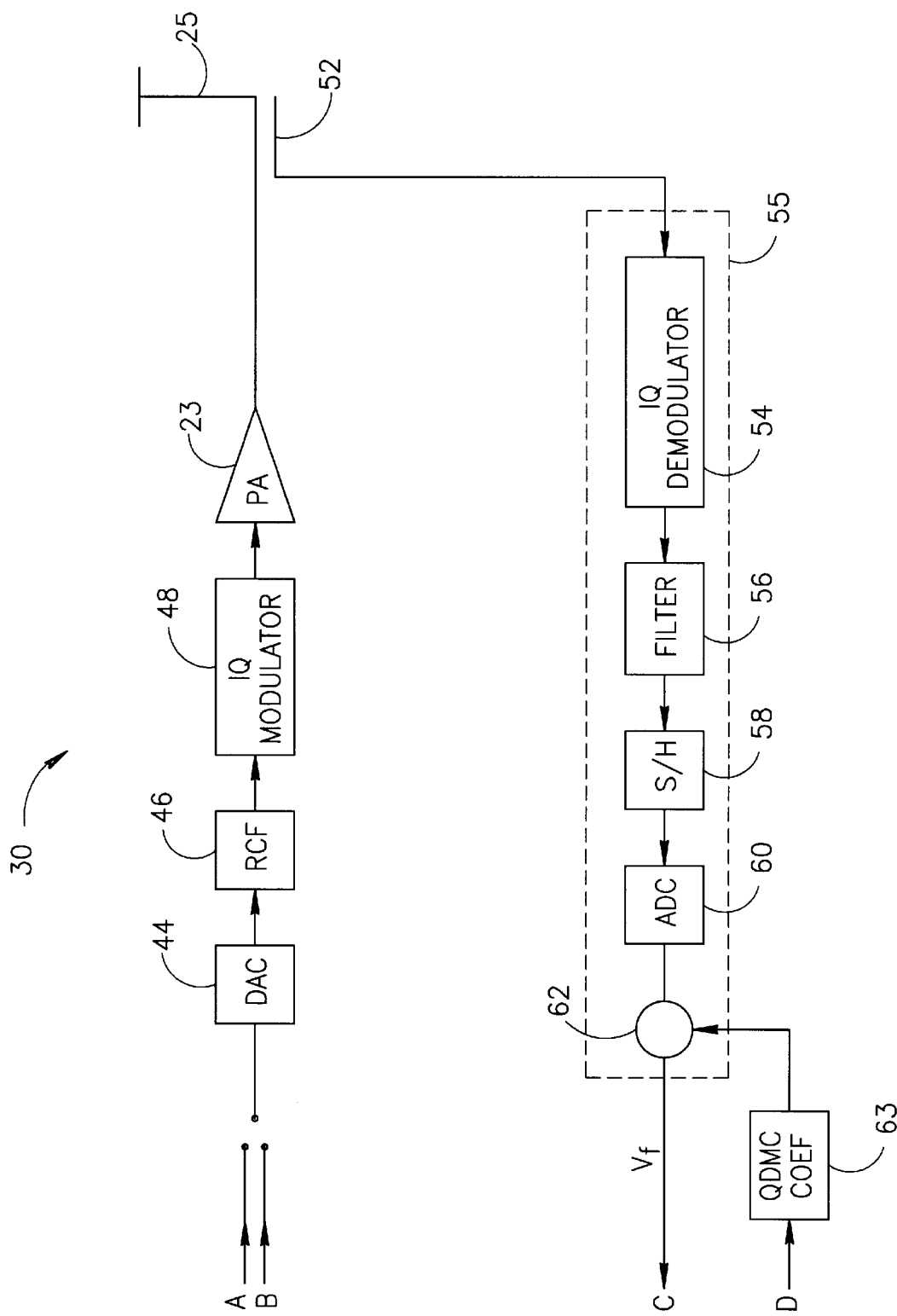

FIGS. 2A and 2B are a schematic block diagram of a transmitter 30, in accordance with an embodiment of the present invention. Transmitter 30 comprises a transmission modulation path 33 which receives bits and shapes them for transmission over an antenna 25. In an embodiment of the invention, modulation path 33 includes a DQPSK modulator 32, a frequency correction unit 34, a first interpolator 36, a second interpolator 38, a mismatch multiplier 40, a third interpolator 42, a digital to analog converter (DAC) 44, a reconstruction filter (RCF) 46, an IQ modulator 48 and a power amplifier 23, as described, for example, in the above mentioned publication of Cavers. In an exemplary embodiment, frequency correction unit 34 is as described in U.S. patent application Ser. No. 09/187,840, titled "frequency tuning apparatus for radio transceivers".

A feedback line 52 senses the signals transmitted by amplifier 23 and passes them through a reverse conversion unit 55 which substantially reverses the operation of modulation path 33, bringing the signals back to a state in which they can be compared to the signals provided by second interpolator 38.

In an exemplary embodiment, reverse conversion unit 55 comprises an IQ demodulator 54 (corresponding to modulator 48), a filter 56, a sample and hold (S/H) 58, an analog to digital converter (ADC) 60 (corresponding to DAC 44) and a mismatch multiplier 62 (corresponding to multiplier 40). In an embodiment of the invention, reverse conversion unit 55 is constructed substantially as described in Quantization Analysis and Design of a Digital Predistortion Linearizer for RF Power Amplifiers", L. Sundstorm, M. Faulkner and M. Johansson, IEEE Trans. On Vehicular Technology, Vol. 45, No. 4, November 1996.

Mismatch multipliers 40 and 62 are used, for example, with respective coefficient providing units 41 and 63, which provide values for the multiplication. In an exemplary embodiment, the values in units 41 and 63 are periodically updated by an IQ mismatch correction unit 77. In an exemplary embodiment, IQ mismatch correction unit 77 operates using a method described in "New Methods for Adaptation of Quadrature Modulators and Demodulators Amplifier Linearization Circuits", J. K. Cavers, IEEE Trans. On Vehicular Technology, Vol. 46, No. 3, August 1997.

In some embodiments of the invention, a predistorter 80 is situated between second interpolator 38 and mismatch multiplier 40. Predistorter 80 compensates for non-linearities introduced by one or more of the elements of modulation path 33, particularly of power amplifier 23 and/or IQ modulator 48. In an exemplary embodiment, predistorter 80 comprises a complex multiplier 82 and a look up table (LUT) 84 which provides values to be used by complex multiplier 82. In an exemplary embodiment, LUT 84 comprises complex numbers formed of real and imaginary parts stored separately, such that each entry of LUT 84 has a real (I) value and an imaginary (Q) value. In one embodiment of the invention, LUT 84 comprises 256 entries, although substantially any number of entries may be used. In an exemplary embodiment, multiplier 82 performs complex multiplication of the complex number from second interpolator 38 with the complex number from LUT 84.

Figure 3A:
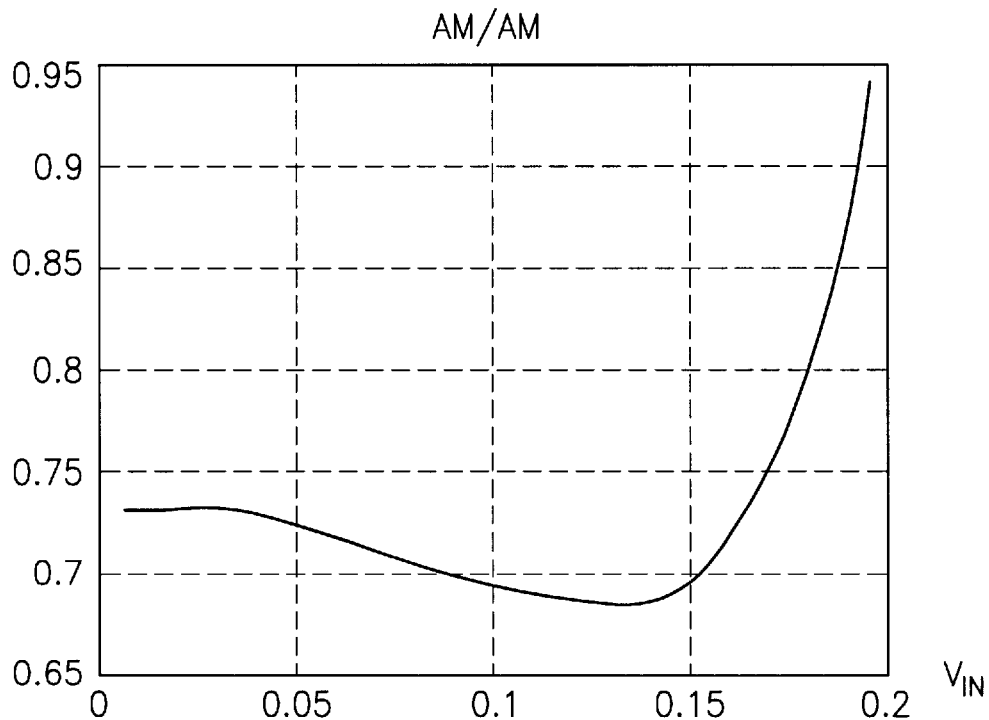
FIGS. 3A and 3B are graphs which illustrate exemplary values of predistorter LUT, in accordance with an embodiment of the present invention.
Figure 3B:
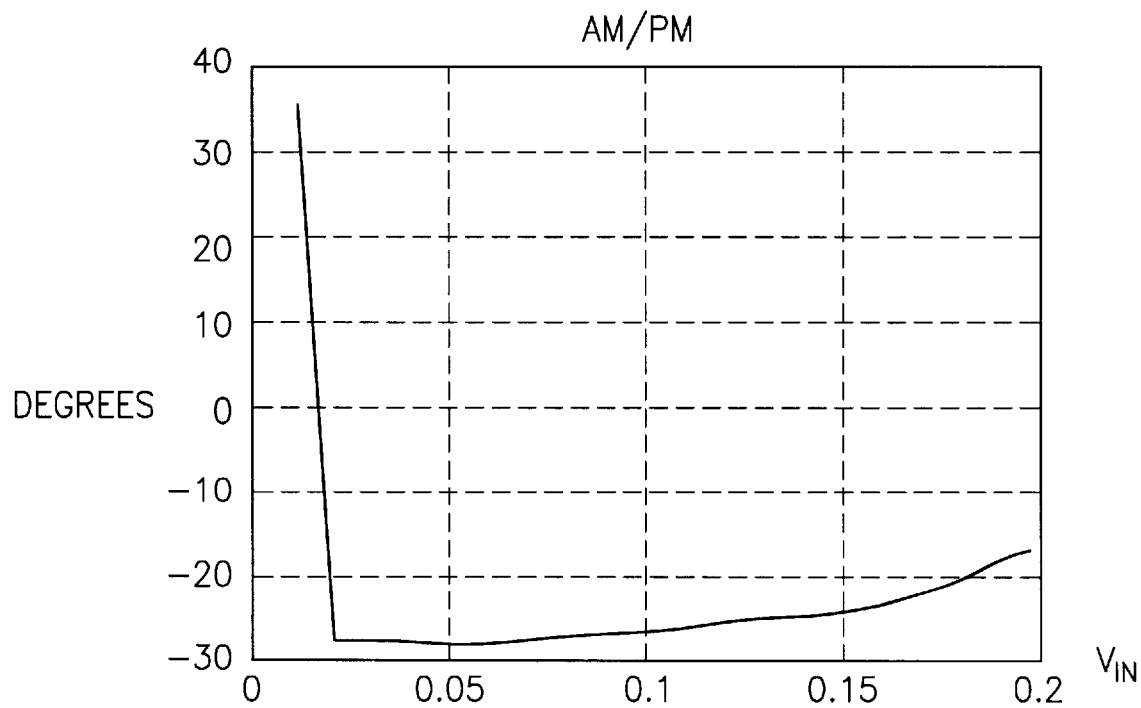

FIGS. 3A and 3B are graphs which illustrate exemplary values of LUT 84, in accordance with an embodiment of the present invention. FIG. 3A shows the values which multiply the amplitude of the modulated input signals received from interpolator 38, as a function of the amplitude of the input signals. FIG. 3B shows the values which are added to the phase of the input signals as a function of the amplitude of the input signals.

In an exemplary embodiment, predistorter 80 comprises an indexer 86 which determines the entry of LUT 84 to multiply the modulated samples. In some embodiments of the invention, indexer 86 determines the entry of LUT 84 as the magnitude, i.e., $\sqrt{I^2+Q^2}$, of the modulated samples from second interpolator 38. In an exemplary embodiment, the magnitude calculation is performed using approximation methods known in the art in order to avoid performing floating point calculations.

In some embodiments of the invention, a trainer 70 monitors the values of LUT 84 such that they substantially always compensate for the non-linearities of modulation path 33, which non-linearities change with time. Trainer 70 receives the samples from second interpolator 38 through a delay unit 68 and the samples from the output of power amplifier 23 as converted by reverse conversion unit 55. In an exemplary embodiment, trainer 70 matches the received samples to form pairs comprising a first value of a sample received from second interpolator 38 and a second value of the same sample representing the sample after it is passed through power amplifier 23 and reverse conversion unit 55. In an exemplary embodiment, delay unit 68 delays the samples from second interpolator 38 for a suitable, predetermined or adaptively determined, time period such that the same sample is received concurrently from the first interpolator and from reverse conversion unit 55. In an exemplary embodiment, the delay period is calculated by maximizing the correlation between the output of second interpolator 38 and the output of reverse conversion unit 55. Alternatively, any other method known in the art, adaptive, pre-calibrating and/or predetermining in each operation, is used to determine the delay period.

In some embodiments of the invention, trainer 70 operates in two different states depending on the operation time of transmitter 30. When transmitter 30 is switched on it operates in an initialization state and afterwards it operates in an adaptive state.

Figure 4:
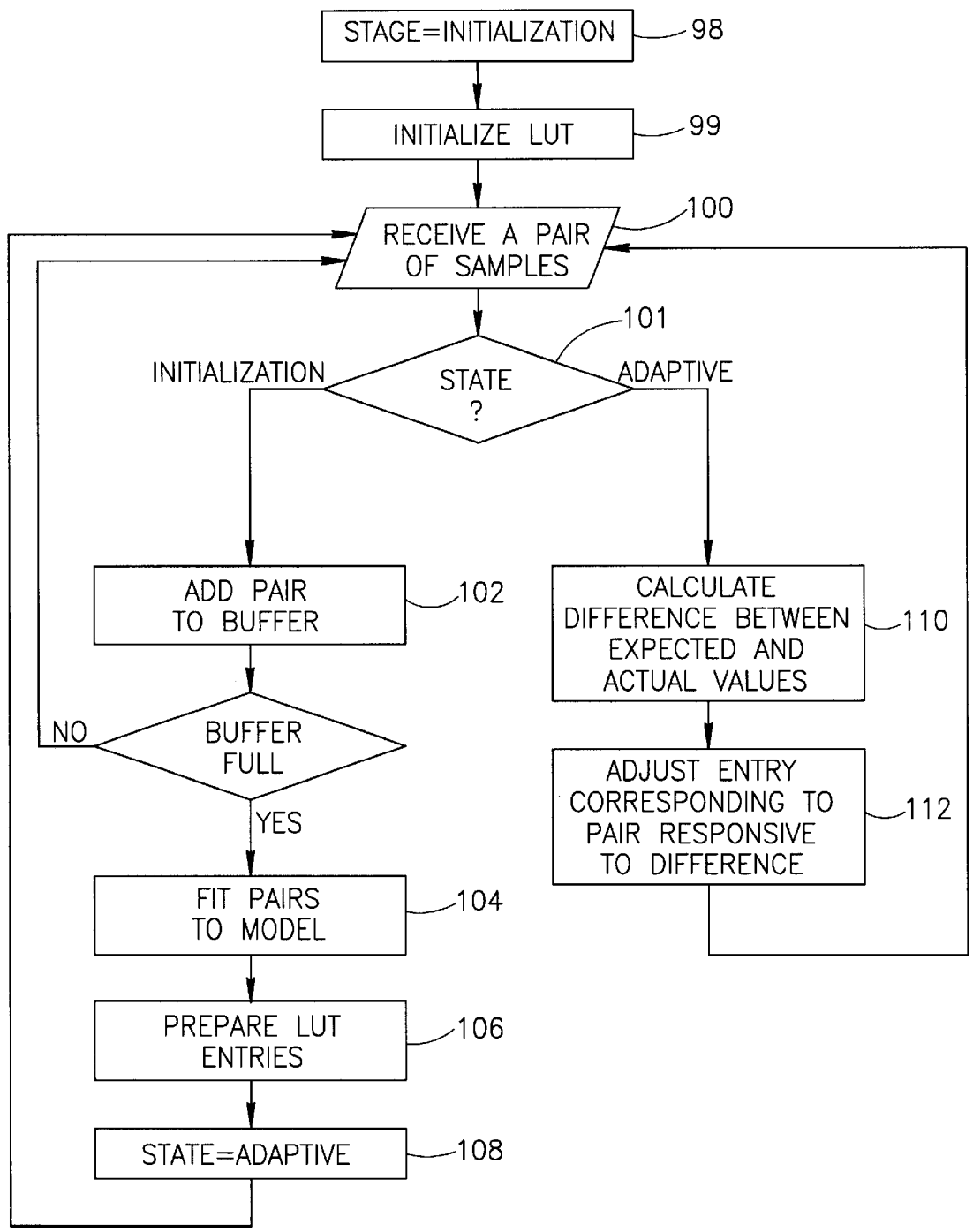
FIG. 4 is a flowchart of the operation of a predistortion LUT trainer, in accordance with an embodiment of the present invention.

FIG. 4 is a flow chart of the operation of trainer 70, in accordance with an embodiment of the present invention. When transmitter 30 is switched on, trainer 70 is set to an "initialization" state (98). In addition, LUT 84 is initialized (99) with neutral values (i.e., '1' and '0' for I and Q respectively) which do not affect the signals passing through transmission modulation path 33. In an exemplary embodiment, as described above, whenever transmitter 30 transmits samples, trainer 70 receives (100) pairs of values of the transmitted samples, including the values before their passage through predistorter 80 and the values after the samples are amplified by power amplifier 23.

In some embodiments of the invention, the pairs of samples used during the initialization state are from a regular data transmission. In an exemplary embodiment, the pairs used during the adaptive state are also from regular data transmissions. Alternatively, the pairs of samples used during the initialization state are generated by a special transmission which is used substantially only for calculating the values of LUT 84. In an exemplary embodiment, the special transmission generates pairs of samples which cover most or even all of the entries of LUT 84.

At this point the current state of the trainer is determined (101) and trainer 70 operates accordingly.

During the "initialization" state, the samples are accumulated (102) in a memory buffer 72 (FIG. 2A) of trainer 70. In some embodiments of the invention, the accumulation is performed over a predetermined amount of time, e.g., over the time of transmitting two data slots, which generally include together a number of samples of the order of the number of entries of LUT 84, e.g., between about 200–350 samples. In the Japanese RCR27C transmission standard, for example, two data slots include 280 samples. In some embodiments of the present invention, only some of the pairs of values are accumulated during this time as the apparatus of transmitter 30 may be performing additional tasks concurrently with the initialization state. In some embodiments of the present invention, a loss of between about 10–25% of the pairs of values due to the other tasks performed by the apparatus of transmitter 30, is considered acceptable.

Alternatively, accumulating (102) the pairs of values is performed until a predetermined number of pairs are accumulated.

After a sufficient number of pairs of samples are accumulated, trainer 70 fits (104) the accumulated pairs into a parameteric model of a non-linear part of modulation path 33. In some embodiments of the invention, the parameteric model comprises a composite model of the non-linear elements of transmitter 30 between the points of acquisition of the accumulated pairs, e.g., of power amplifier 23 and of IQ modulator 48. Alternatively, the parameteric model comprises a model of power amplifier 23, neglecting non-linearities of other elements of transmitter 30. In an exemplary embodiment, the fitting of the pairs into the model is performed relating to the model as an inverse (output to input) transfer function of power amplifier 23 and of IQ modulator 48. Thus, the received fitted model has the desired transfer function of predistorter 80. Alternatively, the fitting is performed so as to form a direct transfer model of power amplifier 23 and of IQ modulator 48. Thereafter, the inverse of the direct transfer model is calculated using inversion methods known in the art. Further alternatively, any other transfer function related to the non-linear elements of transmitter 30, is used.

In an exemplary embodiment, the pairs are fit into the parameteric model in order to assign constant values to the parameters of the parameteric model. In an exemplary embodiment, the pairs are fit into a polynomial parameteric model, in which the parameters are the coefficients of the various order elements of the model. In an exemplary embodiment, the polynomial model is chosen to best represent a function related to power amplifier 23 according to models known in the art. In some embodiments of the invention, the polynomial model includes only elements of predetermined orders, e.g., elements up to the fourth order.

In an embodiment of the present invention, the parameteric model is described by the following equation:

$$f(V_{in}, b_0, b_1, b_2, \ldots, b_L) = b_0 + b_1 V_{in} + b_2 V_{in}^2 + \ldots + b_L V_{in}^L \quad (1)$$

in which $b_1, b_2, \ldots, b_L$ are the coefficients of the parameteric model. In an exemplary embodiment of the invention, the least square estimate is given by:

$$\operatorname*{argmin}_{b_i} \sum_{i=1}^{N} [\bar{f}_i(V_{in,i}) - f_i(V_{in,i}, b_0, b_1, b_2, \ldots, b_L)]^2 \quad (2)$$

in which N is the number of accumulated pairs of values and $V_{in}, i, \bar{f}_i(V_{in})$ are the pairs of accumulated values.

In some embodiments of the present invention, rather than fitting (104) the accumulated pairs into a single parameteric model, the pairs are fit into a plurality of parameteric models. In an exemplary embodiment, one of the models into which the accumulated pairs best fit, is chosen. Alternatively or additionally, the values of different groups of entries of LUT 84 are set using different ones of the fit models.

In some embodiments of the invention, the pairs are fit into the model using a least squared (LS) method. Alternatively, the fitting is performed using any other suitable fitting method, such as the splines and B-splines curve fitting methods.

Based on the fitted parameteric model, values are generated (106) for all the entries of LUT 84. In an exemplary embodiment, the generated values of LUT 84 are adjusted such that power amplifier 23 provides a desired linear amplification K.

It is noted that the adjusted linear amplification of power amplifier 23 may be changed by multiplying all the entries of LUT 84 by a common constant. For example, when it is determined that due to temperature or other environmental changes power amplifier 23 transmits at too high or too low an amplitude, all the entries of LUT 84 are multiplied by a common constant correcting the amplitude.

Thereafter, in the embodiment of FIG. 4, the state of trainer 70 is set (108) to "adaptive". In the adaptive state, each received pair of samples is used to calculate (110) the difference between a desired linear amplification to be performed by power amplifier 23 and the actual amplified value provided by power amplifier 23. The entry of LUT 84 which is used in predistorting the received pair of samples is adjusted (112) responsive to the calculated difference. It is noted that the adjustment of any specific entry of LUT 84 during the adaptive state is performed at unpredictable times according to the values which are transmitted by transmitter 30.

In an exemplary embodiment, the adjustment is performed as described in "The Effect of Quadrature Modulator and Demodulator Errors on Adaptive Digital Predistorters for Amplifier Linearization", J. K. Cavers, IEEE Trans. On Vehicular Technology, Vol. 46, No. 2, May 1997.

Alternatively or additionally, any other adaptive algorithm may be used in adjusting the entry responsive to the calculated difference. In some embodiments of the invention, the adjusting (112) is performed according to equation (3):

$$F(V_m) = F(V_m) \left[ 1 - \alpha \frac{V_f - K V_m}{V_f} \right] \quad (3)$$

in which $V_f$ is the output of reverse conversion unit 55 which represents the output from power amplifier 23, $V_m$ is the value representing the input to LUT 84, F represents the function of LUT 84, K represents the desired linear amplification of power amplifier 23 (together with predistorter 80), and $\alpha$ is a small and positive (i.e., $0 \leq \alpha < 1$) constant, e.g., between 0.1–0.35, which controls the rate at which the operation of trainer 70 converges.

In some embodiments of the invention, trainer 70 has a plurality of different "adaptive" states which differ in the details of the adaptive algorithm they use in adjusting (112) the respective entry of LUT 84. In some embodiments of the invention in which equation (3) is used, different adaptive states use different values of the constant $\alpha$. For example, when the values in LUT 84 are relatively far from convergence a relatively high value of $\alpha$ is used, e.g., 0.35, while when LUT 84 is relatively close to convergence a lower value of $\alpha$ is used, e.g., 0.1. In an exemplary embodiment, for a short period after the "initialization" state an adaptive state with a high value of $\alpha$ is used. Thereafter, a second adaptive state is operated with a low value of $\alpha$.

In an exemplary embodiment, as described above, the initialization method (104–106) is performed only once during the operation of transmitter 30. Alternatively, trainer 70 may return to the initialization state during the operation of transmitter 30. In some embodiments of the invention, when transmitter 30 detects during the adaptive state that power amplifier 23 is providing values which are far from linear amplification, trainer 70 automatically reverts to the initialization state. In an exemplary embodiment, the detection is performed by trainer 70. Alternatively or additionally, trainer 70 reverts periodically to the initialization state, irrespective of the values in LUT 84. In some embodiments of the invention in which transmitter 30 is included in a telephone set, trainer 70 reverts to the initialization state at the beginning of each new telephone conversation. Alternatively or additionally, trainer 70 reverts to the initialization state each time transmitter 30 moves into a new cell governed by a different home station. Further alternatively or additionally, trainer 70 reverts to the initialization state when its transmission frequency changes.

Alternatively to using a multi-state trainer as described in FIG. 4, only the initialization state is used and the trainer continuously accumulates values (102), fits them into the model (104) and updates the LUT (106). Further alternatively, a multi state method is used without using the parameter fitting method (104–106). Instead, any other method known in the art, is used in calculating the initial values of LUT 84.

Figure 5:
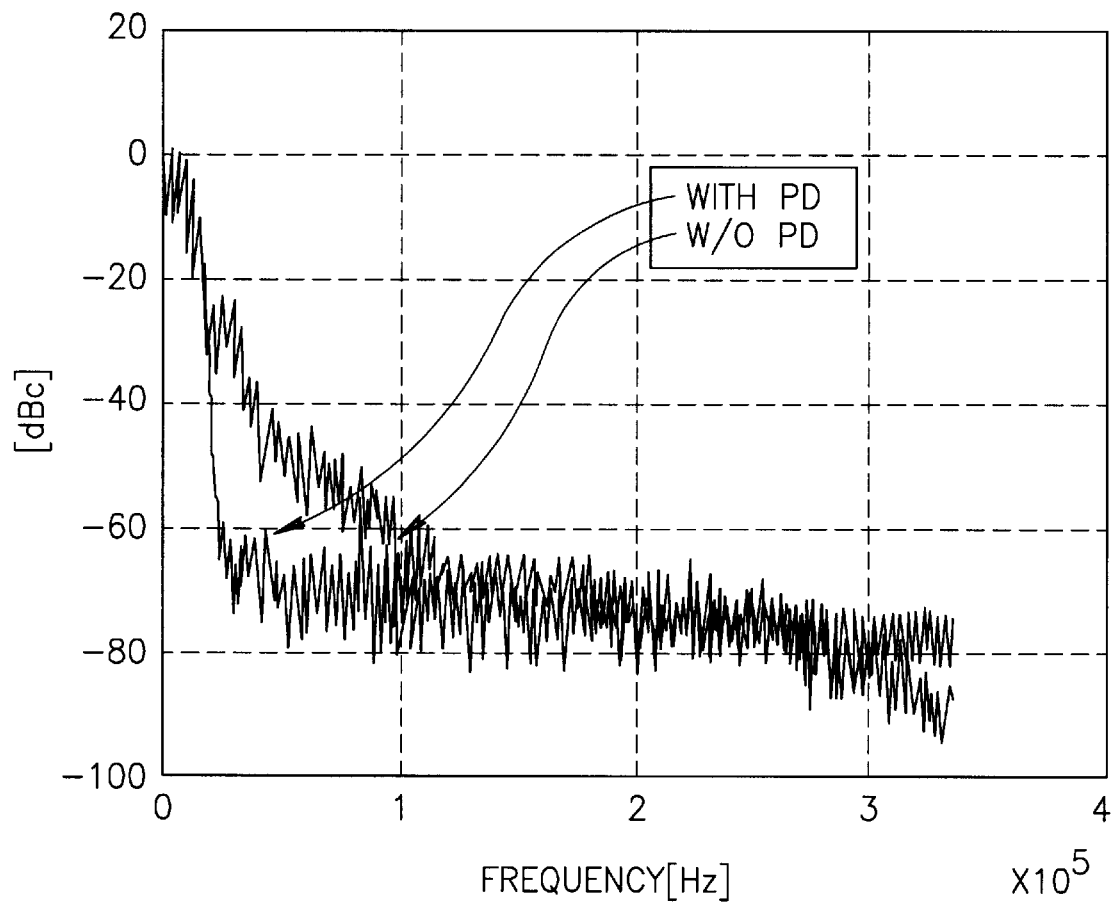
FIG. 5 is a graph comparing the performance of a transmitter in accordance with an embodiment of the present invention and a similar transmitter which does not perform predistortion.

FIG. 5 is a graph comparing a simulation performance of transmitter 30 using trainer 70 in accordance with an embodiment of the present invention and a similar transmitter which does not perform predistortion. The transmission of transmitter 30 is performed on a channel with a bandwidth of ±21 KHz around a carrier frequency. It is required that 50 KHz away from the carrier frequency the transmission strength be sufficiently low so as not to interfere with other transmitters in the vicinity of transmitter 30. For example, the Japanese RCR27C standard requires that the adjacent channel power ratio (ACPR) of transmitters, be lower than 45 dB at 50 KHz away from the carrier frequency and be lower than −60 dB at 100 KHz away from the carrier frequency. As shown in FIG. 5, the ACPR at 50KHz away from the carrier frequency is −65.62 dB for transmitter 30 and only −42.5 dB for a transmitter without predistortion. The ACPR at 100 KHz away from the carrier frequency is −67.35 dB for transmitter 30 and only −56.22 dB for a transmitter without predistortion.

It is noted that unlike training methods of the prior art which converge after relatively long periods, i.e., after 100–200 slots, the accurate results shown in FIG. 5 are achieved within a relatively short period, i.e., about ten transmission slots, due to the combined use of the initialization state and the adaptive state. In an exemplary embodiment of the invention, a first transmitted slot of transmitter 30 is used for level control, second and third slots are used for setting the values of LUT 84 in the initialization state, ten following slots are used for IQ mismatch cancellation and thereafter the transmitted slots are used in accordance with the above described adaptive method. Alternatively or additionally, the transmitted slots are used in any other order and/or one or more of the transmitted slots are used for a plurality of tasks.

Although the above described embodiments show trainer 70 as receiving the values representing the samples before they are distorted by power amplifier 23 from interpolator 38, in other embodiments of the invention, these values are received from other points before predistorter 80, e.g., from interpolator 36.

Alternatively or additionally, trainer 70 receives values representing the samples before they enter power amplifier 23 from after predistorter 80 instead of, or in addition to, the values from before the predistorter (i.e., from interpolator 38). In some embodiments of the invention, the values representing the samples before they enter power amplifier 23 are taken from a first point during the initialization state and from a second point during the adaptive state.

In some embodiments of the invention, when transmitter 30 is operated, LUT 84 is filled with pre-calculated values which are stored during factory calibration and/or during previous operation of the transmitter. During the initialization state the sample values received from reverse conversion unit 55 are multiplied by the respective entries of LUT 84 before they are entered to the parameteric model. Alternatively, any other method is used to prevent the pre-calculated values of LUT 84 from affecting the values produced during the initialization state.

It is noted that some of the units of transmitter 30 may be implemented either in software (on one or more processors) or in hardware. In an exemplary embodiment of the invention, modulator 32, frequency correction unit 34, trainer 70 and IQ mismatch correction unit 77 are implemented in software on a single processor, such as a digital signal processor (DSP). In an exemplary embodiment, the remaining elements of transmitter 30 are implemented in hardware. Alternatively, more or less of the elements of transmitter 30 are implemented in hardware. For example, in some embodiments, interpolator 36 is also implemented in software with the processor implementing modulator 32 and frequency correction unit 34.

Although the above described embodiments were described with relation to transmitter 30, it will be understood by those skilled in the art that the present invention may be used with relation to other transmitters. For example, the present invention is not limited to transmitters of any specific modulation method, but rather may be used with substantially any non-constant envelope modulation methods, including, but not limited to, MPSK, DPSK and QAM.

It will be appreciated that the above described methods may be varied in many ways, including, changing the order of steps, and the exact implementation used. It should also be appreciated that the above described description of methods and apparatus are to be interpreted as including apparatus for carrying out the methods and methods of using the apparatus.

The present invention has been described using non-limiting detailed descriptions of embodiments thereof that are provided by way of example and are not intended to limit the scope of the invention. It should be understood that features described with respect to one embodiment may be used with other embodiments and that not all embodiments of the invention have all of the features shown in a particular figure or described with respect to one of the embodiments. Variations of embodiments described will occur to persons of the art. Furthermore, the terms "comprise," "include," "have" and their conjugates, shall mean, when used in the claims, "including but not necessarily limited to." The scope of the invention is limited only by the following claims.

What is claimed is:

1. A method comprising:
   accumulating a plurality of pairs of values, wherein at least one pair represents an input value sampled at an input of a non-linear element of a transmitter and an output value sampled at an output of a power amplifier of the transmitter;

fitting the pairs of values into a parametric model of the non-linear element and the power amplifier; and generating two or more values of a predistortion look up table responsive to the fitted parametric model by calculating an initial predistortion value of at least one entry of the predistortion look up table using a non-adaptive method and adjusting the calculated initial predistortion value using an adaptive method.

2. A method according to claim 1, wherein fitting the pairs of values into the parametric model comprises fitting the pairs of values into an inverse transfer function of the non-linear elements and the power amplifier.

3. A method according to claim 1, wherein fitting comprises fitting using a least squares fitting method.

4. A method according to claim 1, wherein fitting comprises determining the coefficients of polynomials of a polynomial model of the parametric model.

5. A method according to claim 1, wherein accumulating the pairs comprises accumulating a predetermined number of pairs.

6. A method according to claim 1, wherein accumulating the pairs comprises accumulating the pairs over a predetermined amount of time.

7. A method according to claim 1, wherein accumulating comprises accumulating a first pair of values before they are multiplied by a second pair of values from the predistortion look up table in a modulation path leading to the non-linear elements and the power amplifier.

8. A method according to claim 1, wherein accumulating comprises accumulating a first pair of values after they are multiplied by a second pair of values from the predistortion table in a modulation path leading to the non-linear elements.

9. A method comprising:

determining a plurality of pairs of values wherein at least one pair represents an input value sampled at an input of a non-linear element of a transmitter and an output value sampled at an output of a power amplifier of the transmitter;

calculating using a non-adaptive method, an initial predistortion value of at least one entry of a predistortion look up table, wherein the at least one entry is responsive to at least one of the determined pairs of values; and adjusting, using an adaptive method, the calculated initial predistortion value of at least one of the entries of the look up table responsive to at least one of the determined pairs of values.

10. A method according to claim 9, wherein calculating the initial predistortion value of at least one of the entries using the non adaptive method comprises adjusting each of the at least one of the entries responsive to a plurality of the determined pairs.

11. A method according to claim 10, wherein adjusting each of the at least one of the entries responsive to a plurality of the determined pairs comprises adjusting the entries responsive to a parametric model in which the plurality of the determined pairs are fitted.

12. A method according to claim 9, wherein adjusting the calculated initial predistortion value of at least one of the entries using the adaptive method comprises adjusting at least one of the entries responsive to a single one of the determined pairs.

13. An apparatus comprising:

a trainer to receives a plurality of pairs of values, wherein at least one pair represents an input value sampled at an input of a non-linear element of a transmission modulation path and an output value sampled at an output of a power amplifier to fit the pairs of values into a parametric model of the non-linear elements and the power amplifier and to generates two or more values of a predistortion look up table based on the fitted parametric model by calculating an initial predistortion value of at least one entry of the predistortion look up table using a non-adaptive method and adjusting the calculated initial predistortion value using an adaptive method.

14. The apparatus according to claim 13, wherein the trainer is able to fit the pairs of values into an inverse transfer function of the non-linear element and the power amplifier wherein, input values of the at least one of the non-linear element and the power amplifier are received as a function of output values of the at least one of the non-linear element and the power amplifier.

15. The apparatus according to claim 14, wherein the inverse transfer model comprises a polynomial model.

16. The apparatus of claim 13 further, comprising:

a modulator; and a predistorter, wherein the trainer is able to sets the values of a predistortion look up table of the predistorter, so as to linearize the power amplifier and the modulator.

17. An apparatus, comprising:

a trainer to receive a plurality of pairs of values wherein, at least one pair represents an input value sampled at an input of a non-linear element of a transmission modulation path and an output values -sampled at an output of a power amplifier, to calculate an initial predistortion value of at least one entry of entries of a predistortion look up table responsive to at least one of determined pairs of values using a non adaptive method and to adjusts the calculated initial predistortion value of at least one of the entries of the predistortion look up table responsive to at least one of the determined pairs of values using an adaptive method.

18. The apparatus according to claim 17, wherein the trainer comprises a processor.

19. The apparatus according to claim 17, wherein the the trainer is able to adjust the at least one entry of entries responsive to a plurality of the determined pairs using the non adaptive method and to adjusts the at least one of the entries using the adaptive method responsive to a single one of the determined pairs.

20. The apparatus of claim 17 further, comprising:

a modulator; and a predistorter;

wherein the trainer is able to sets the values of the predistortion look up table of the predistorter, so as to linearize the power amplifier and the modulator.

* * * * *